United States Patent
Narushima et al.

(10) Patent No.: US 10,329,686 B2
(45) Date of Patent: Jun. 25, 2019

(54) METHOD FOR PRODUCING SINGLE CRYSTAL

(71) Applicant: SUMCO CORPORATION, Tokyo (JP)

(72) Inventors: Yasuhito Narushima, Tokyo (JP); Toshimichi Kubota, Tokyo (JP); Masayuki Uto, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 15/535,578

(22) PCT Filed: Nov. 17, 2015

(86) PCT No.: PCT/JP2015/082319
§ 371 (c)(1),
(2) Date: Jun. 13, 2017

(87) PCT Pub. No.: WO2016/103987
PCT Pub. Date: Jun. 30, 2016

(65) Prior Publication Data
US 2017/0327966 A1     Nov. 16, 2017

(30) Foreign Application Priority Data
Dec. 24, 2014    (JP) .................... 2014-261122

(51) Int. Cl.
*C30B 15/04*    (2006.01)
*C30B 15/20*    (2006.01)
*C30B 29/06*    (2006.01)

(52) U.S. Cl.
CPC .......... *C30B 15/04* (2013.01); *C30B 15/20* (2013.01); *C30B 29/06* (2013.01)

(58) Field of Classification Search
CPC combination set(s) only.
See application file for complete search history.

(56) References Cited

U.S. PATENT DOCUMENTS 6,302,957 B1 *  10/2001  Ito ..................... C03B 32/00
                                                      117/13
2003/0159647 A1 *  8/2003  Arvidson ............ C30B 15/02
                                                      117/30

(Continued)

FOREIGN PATENT DOCUMENTS

CN    101319350    12/2008
CN    103635613     3/2014

(Continued)

OTHER PUBLICATIONS

International Search Report (ISR) issued in Japan Patent Application No. PCT/JP2015/082319, dated Feb. 6, 2016.

(Continued)

*Primary Examiner* — Erin F Bergner
(74) *Attorney, Agent, or Firm* — Greenblum & Bernstein, P.L.C.

(57) ABSTRACT

A manufacturing method of a monocrystal includes: a shoulder-formation step to form a shoulder of the monocrystal; and a straight-body-formation step to form a straight body of the monocrystal, in which, in the shoulder-formation step, providing that a distance from a lowermost portion inside the crucible to a top surface of the dopant-added melt is defined as H (mm) and a radius of the top surface of the dopant-added melt is defined as R (mm), the shoulder starts to be formed in a condition that a relationship of 0.4<H/R<0.78 is satisfied.

5 Claims, 5 Drawing Sheets

(56) References Cited

U.S. PATENT DOCUMENTS

| | | | |
|---|---|---|---|
| 2008/0302294 A1* | 12/2008 | Ohkubo | C30B 15/305 |
| | | | 117/13 |
| 2009/0314996 A1* | 12/2009 | Kawazoe | C30B 29/06 |
| | | | 252/500 |
| 2010/0101485 A1 | 4/2010 | Fu et al. | |
| 2010/0151667 A1* | 6/2010 | Narushima | C30B 15/04 |
| | | | 438/510 |
| 2011/0017948 A1 | 1/2011 | Fukuda | |
| 2015/0233014 A1 | 8/2015 | Luter et al. | |

FOREIGN PATENT DOCUMENTS

| | | |
|---|---|---|
| EP | 2256235 | 12/2010 |
| JP | H07-61893 A | 3/1995 |
| JP | H09-278581 A | 10/1997 |
| JP | 3555081 B2 | 5/2004 |
| JP | 2009-057232 A | 3/2009 |
| JP | 2009-215117 A | 9/2009 |
| JP | 2010-100474 A | 5/2010 |
| WO | 2014/039976 A1 | 3/2014 |
| WO | 2014/175120 A1 | 10/2014 |

OTHER PUBLICATIONS

International Preliminary Report on Patentability issued in International Application No. PCT/JP2015/082319, dated Jun. 27, 2017.
CN OA issued in Chinese Application No. 201580069135.6 dated Dec. 10, 2018, with English translation.
Terashima et al., Silicon Melt Density—Problems of Archimedean Technique, Materials Science in Semiconductor Processing vol. 4 (Dec. 31, 2001) pp. 249-251.

\* cited by examiner

FIG. 1

| TRIAL | SILICON MELT AMOUNT | DOPANT AMOUNT | H/R | DISLOCATION POSITION | ABSENCE/PRESENCE OF ABNORMAL GROWTH | REMARKS |
|---|---|---|---|---|---|---|
| 1 | 130.0kg | 1080g | 1.01 | SHOULDER: AT POSITION OF 40 mm OF DIAMETER | PRESENT | — |
| 2 | 124.3kg | 190g ADDED | 0.97 | SHOULDER: AT POSITION OF 40 mm OF DIAMETER | PRESENT | MONOCRYSTAL WAS MANUFACTURED AFTER MONOCRYSTAL OF TRIAL 1 WAS TAKEN OUT OF PULL-UP APPARATUS AND DOPANT WAS ADDED. |
| 3 | 116.4kg | NONE. ADDED | 0.92 | STRAIGHT BODY: AT POSITION OF 60 mm FROM UPPER END | PRESENT | MONOCRYSTAL WAS MANUFACTURED AFTER MONOCRYSTAL OF TRIAL 2 WAS TAKEN OUT OF PULL-UP APPARATUS. |
| 4 | 100.5kg | 160g ADDED | 0.82 | STRAIGHT BODY: AT POSITION OF 10 mm FROM UPPER END | PRESENT | MONOCRYSTAL WAS MANUFACTURED AFTER MONOCRYSTAL OF TRIAL 3 WAS TAKEN OUT OF PULL-UP APPARATUS AND DOPANT WAS ADDED. |
| 5 | 95.0kg | 160g ADDED | 0.78 | STRAIGHT BODY: AT POSITION OF 80 mm FROM UPPER END | PRESENT | MONOCRYSTAL WAS MANUFACTURED AFTER MONOCRYSTAL OF TRIAL 4 WAS TAKEN OUT OF PULL-UP APPARATUS AND DOPANT WAS ADDED. |
| 6 | 93.6kg | NONE. ADDED | 0.77 | NONE | NONE | MONOCRYSTAL WAS MANUFACTURED AFTER MONOCRYSTAL OF TRIAL 5 WAS TAKEN OUT OF PULL-UP APPARATUS. |
| 7 | 93.6kg | ADJUST RESISTIVITY TO THE SAME LEVEL IN TRIAL 6 | 0.77 | NONE | NONE | REPRODUCTION CONFIRMATION TEST OF TRIAL 6 |

INITIAL: CHARGE MATERIAL

PULL-UP MONOCRYSTAL

PULL-UP MONOCRYSTAL («US 10,329,686 B2»)

METHOD FOR PRODUCING SINGLE CRYSTAL

TECHNICAL FIELD

The present invention relates to a manufacturing method of a monocrystal.

BACKGROUND ART

For instance, an epitaxial silicon wafer used for a power MOS transistor requires an extremely low substrate resistivity. In order to sufficiently lower a substrate resistivity of the silicon wafer, there has been known a technique of doping a molten silicon with arsenic (As) or antimony (Sb) as an n-type dopant for a resistivity adjustment in a pull-up step (i.e., during growth of a silicon crystal) of a monocrystalline ingot (hereinafter, referred to as a monocrystal) that is a base material of the silicon wafer (see, for instance, Patent Literature 1).

Patent Literature 1 discloses that occurrence of dislocation can be inhibited by manufacturing a monocrystal in a manner to have a crystal cone (i.e., a shoulder) with an apex angle from 40 degrees to 60 degrees.

CITATION LIST

Patent Literature(s)

Patent Literature 1: Japanese Patent No. 3555081

SUMMARY OF THE INVENTION

Problem(s) to be Solved by the Invention

In some cases, the occurrence of dislocation cannot be inhibited only by adjusting the apex angle of the shoulder as described in the method of Patent Literature 1.

An object of the invention is to provide a manufacturing method of a monocrystal with a low resistivity and an inhibited occurrence of dislocation.

Means for Solving the Problem(s)

As a result of dedicated studies, the inventors have reached the following findings.

In manufacturing a monocrystal by a Czochralski process, a convection flow seems to be occurring in a dopant-added melt received in a crucible by a temperature difference between a part of the melt positioned at a lowermost portion of the crucible and a top surface of the melt. It is considered that this convection flow delivers a heat at a lower part of the dopant-added melt upward, so that the heat is released from the top surface of the melt to decrease the temperature of the melt, and the convection flow is subsequently returned to the lower part, thereby causing a change in the temperature of the melt. It is considered that the change in the temperature of the melt increases occurrence of an abnormal growth in the monocrystal and causes dislocation in the monocrystal.

Moreover, the convection flow seems to be strengthened because a temperature difference between the upper part and the lower part of the dopant-added melt is increased when a distance from the lowermost portion inside the crucible to the top surface of the melt is increased. Accordingly, the following experiments were conducted with expectation that optimizing the amount of the dopant-added melt to be charged in the crucible inhibits fluctuation of the temperature of the melt caused by the convection flow, thereby enabling to inhibit occurrence of dislocation.

<Experiment 1: Relationship Between Dopant-Added Melt Amount and Occurrence of Dislocation>

Firstly, a monocrystal pull-up apparatus including a cylindrical crucible having an outer diameter of 22 inch (558.8 mm (1 inch=25.4 mm)) and an inner diameter of 21.10 inch (536.0 mm) was provided.

The experiment for manufacturing a monocrystal includes: a neck-formation step of forming a neck continuous to a seed crystal; a shoulder-formation step of forming a shoulder; a straight-body-formation step of forming a straight body; a tail-formation step of forming a tail; and a cooling step of cooling the monocrystal after the tail-formation step. Herein, an upper end of the straight body is a portion defined at a boundary with the shoulder and, for instance, represented by a reference numeral 63A in FIG. 4.

A dopant concentration of the dopant-added melt was adjusted by adding red phosphorus (dopant) in a silicon melt such that a resistivity at the upper end of the straight body of the monocrystal was 1.0 mΩ·cm or less.

Manufacturing conditions were determined for manufacturing a monocrystal having a straight body in an 860-mm length and a 200-mm diameter.

The monocrystal during the manufacturing process was observed. When dislocation was confirmed, the manufacturing process was stopped and the subsequent steps were not performed. Further, absence or presence of abnormal growth was also checked.

Figure 1:
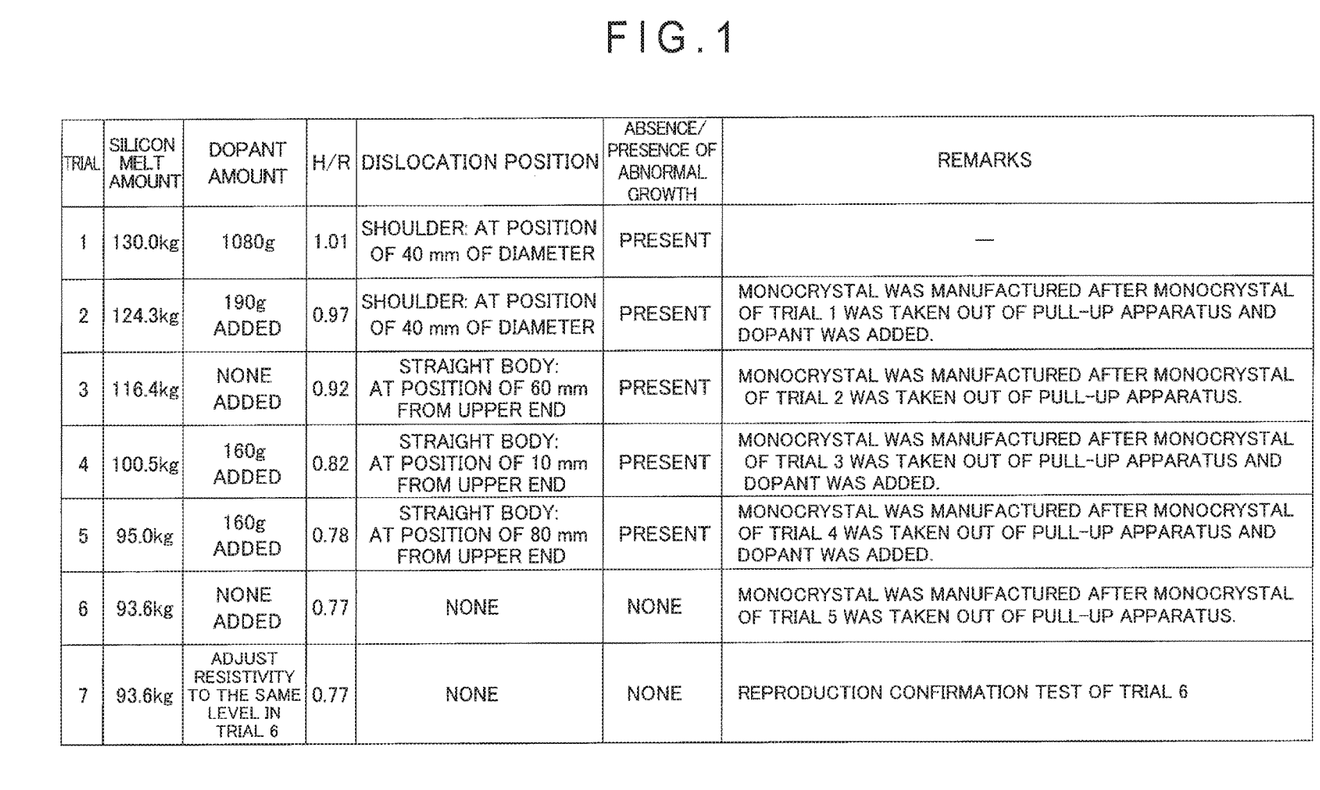
FIG. 1 shows results of Experiment 1 for deriving a manufacturing method of a monocrystal according to the invention, and more specifically, is a Table showing a correlation between an amount of a dopant-added melt and occurrence of dislocation.

FIG. 1 shows a relationship among an amount of the silicon melt, an amount of the dopant, H/R, occurrence positions of the dislocation, and the absence or presence of the abnormal growth, based on the experimental results.

It should be noted that H refers to a distance from the lowermost portion inside the crucible to the top surface of the melt and R refers to a radius of the top surface of the melt. In Experiment 1, under all the experiment conditions (Trials 1 to 7), the top surface of the melt was positioned at a cylindrical portion (i.e., a part having a substantially constant inner diameter) of the crucible. R was 10.72 inch that is a half of the inner diameter of the crucible.

As shown in FIG. 1, the dislocation occurred at the shoulder in Trials 1 to 2 and at the straight body in Trials 3 to 5. No dislocation occurred in Trials 6 to 7. Moreover, the abnormal growth occurred in Trials 1 to 5. No abnormal growth occurred in Trials 6 to 7.

Herein, in Trials 2 to 6, after crystals manufactured in the previous trials (Trials 1 to 5) were taken out of the monocrystal pull-up apparatus, a monocrystal was manufactured. Moreover, before Trials 2, 4, 5 and 6 were performed, the dopant was added in order to adjust the dopant concentration.

It should be noted that Trial 7 is a reproduction confirmation test of Trial 6 in which neither dislocation nor abnormal growth occurred.

Results shown in FIG. 1 reveal that, as an H/R value becomes smaller, in other words, as the amount of the dopant-added melt charged in the crucible becomes smaller, a position where the dislocation occurs is displaced toward the tail, and, when the H/R value is less than 0.78, neither dislocation nor abnormal growth occurs.

It should be noted that, when the silicon melt within the crucible is decreased during an axial growth of the monocrystal, the H/R value becomes continuously decreased. Accordingly, although FIG. 1 does not describe an instance where the H/R value is smaller than 0.77, the results of Trials 6 and 7 show that neither dislocation nor abnormal growth occurs even when the H/R value is smaller than 0.77. It is revealed from a residual amount of the silicon melt in Trials 6 and 7 that neither dislocation nor abnormal growth occurs at least until the H/R value reaches 0.1. In fact, in Trials with the respective H/R values of 0.6 and 0.4, which were performed subsequent to Experiment 1, neither dislocation nor abnormal growth occurred.

<Experiment 2: Correlation Between Dopant-Added Melt Amount and Resistivity Change of Monocrystal Due to Evaporation of Dopant>

It has been known that arsenic, antimony or red phosphorus, which is the dopant for reducing the resistivity of the monocrystal, is liable to be evaporated. It is considered that, providing that the dopant concentrations of the dopant-added melts are equal to each other and areas of the top surfaces of the melts are equal to each other, the respective evaporation amounts of the dopants per unit time become equal to each other even when the different amounts of the dopants are charged in the crucible. Accordingly, it can be expected that, providing that the dopant concentrations of the dopant-added melts are equal to each other, a decrease in the dopant concentration due to the evaporation of the dopant per unit time becomes larger when the less amount of the dopant-added melt is charged in the crucible.

For this reason, the following simulation was performed as Experiment 2.

Dopant-added melts having the same concentration as the dopant concentration in Experiment 1 were charged in a crucible having the same shape as that of the crucible of Experiment 1 so that the respective H/R were 0.4, 0.51, 0.78 and 1.01. Assuming that manufacturing of a monocrystal was started without addition of the dopant and the silicon melt, the resistivity at the upper end of the straight body was simulated at each of the elapsed times after red phosphorus (dopant) was added to the dopant-added melts. The resistivity at the upper end of the straight body when the manufacturing of the monocrystal was started immediately after the dopant was added was set at 0.9 mΩ·cm. This is because the resistivity of the entire straight body can be 0.9 mΩ·cm or less as long as the resistivity at the upper end of the straight body is set at 0.9 mΩ·cm, since the resistivity of the tail of the monocrystal is smaller than that of the shoulder of the monocrystal.

Figure 2:
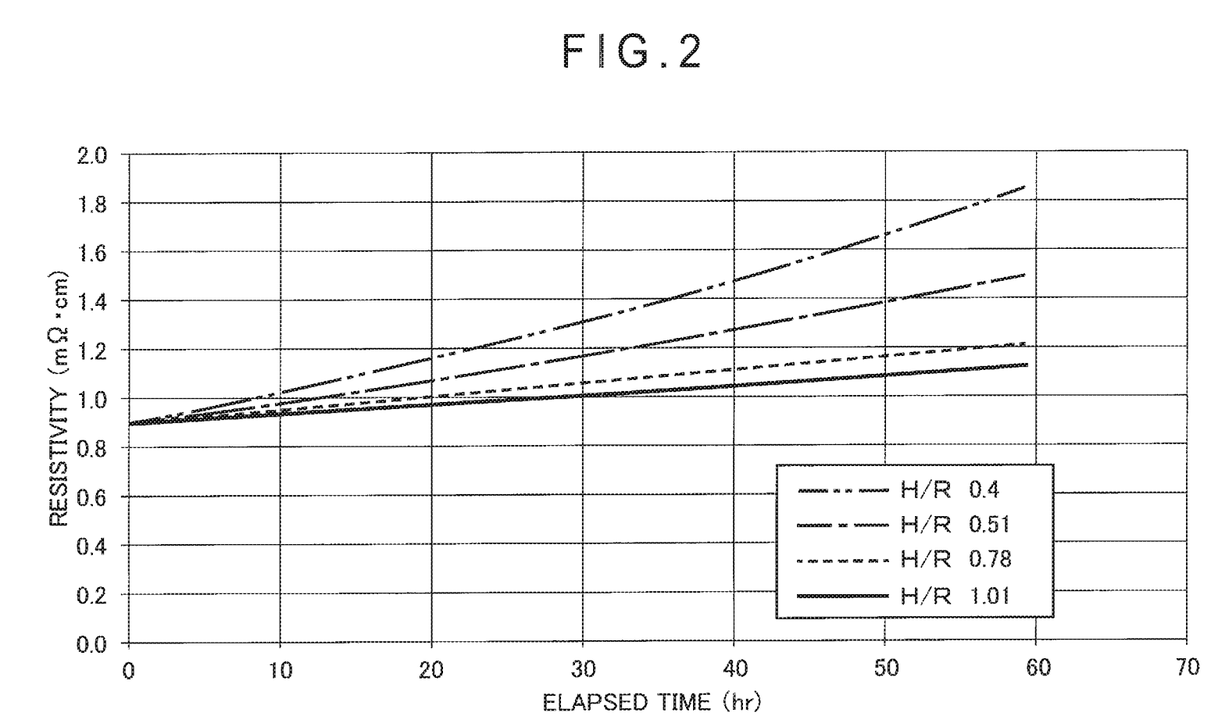
FIG. 2 shows results of Experiment 2 for deriving the manufacturing method, and more specifically, is a graph showing a correlation between the amount of the dopant-added melt and a resistivity change of the monocrystal due to evaporation of the dopant.

Simulation results are shown in FIG. 2.

It was confirmed as shown in FIG. 2 that the resistivity increased as the time elapsed since the dopant was evaporated. Moreover, it was recognized that the resistivity was liable to be increased as H/R became smaller. This coincides with the above assumption that the decrease in the dopant concentration is larger when the amount of the dopant-added melt is smaller.

Herein, considering a so-called single-charge pull-up method in which a plurality of monocrystals are pulled up continuously one by one without adding the dopant and the silicon melt in order to enhance a manufacturing efficiency, the change in the resistivity as the time elapses is preferably small. Moreover, considering that the manufacturing of the monocrystal sometimes cannot be started immediately after the dopant is added, that it takes about ten hours to pull up a single monocrystal, or that a certain level of a performance is required for a silicon wafer, the resistivity of the straight body of the monocrystal having started to be manufactured at the elapsed time of ten hours preferably does not far exceed 1.0 mΩ·cm.

Accordingly, even when the manufacturing of the monocrystal is started after the elapse of ten hours after the dopant is added, the resistivity of the entire straight body is able to not far exceed 1.0 mΩ·cm at least when H/R exceeds 0.4.

The present invention has been achieved based on the above-mentioned findings.

According to an aspect of the invention, in a manufacturing method of a monocrystal using a monocrystal pull-up apparatus in accordance with Czochralski process, the apparatus includes: a chamber; a crucible disposed in the chamber and configured to receive a dopant-added melt in which a dopant is added to a silicon melt; and a pull-up unit configured to pull up a seed crystal after the seed crystal is brought into contact with the dopant-added melt, and the method includes: a shoulder-formation step to form a shoulder of the monocrystal; and a straight-body-formation step to form a straight body of the monocrystal, in which, in the shoulder-formation step, providing that a distance from a lowermost portion inside the crucible to a top surface of the dopant-added melt is defined as H (mm) and a radius of the top surface of the dopant-added melt is defined as R (mm), the shoulder starts to be formed in a condition that a formula (1) is satisfied, $$0.4 < H/R < 0.78 \quad (1).$$

According to the above aspect of the invention, when a monocrystal is manufactured in a manner to satisfy the formula (1), the manufactured monocrystal can exhibit a low resistivity and an inhibited occurrence of dislocation.

In the manufacturing method with the above arrangement, preferably, the dopant is red phosphorus, and the red phosphorus is added to the dopant-added melt such that a resistivity at an upper end of the straight body is 1.0 mΩ·cm or less.

In the manufacturing method with the above arrangement, preferably, the dopant is arsenic, and the arsenic is added to the dopant-added melt such that a resistivity at an upper end of the straight body is 2.0 mΩ·cm or less.

In the manufacturing method with the above arrangement, preferably, the dopant is antimony, and the antimony is added to the dopant-added melt such that a resistivity at an upper end of the straight body is 15 mΩ·cm or less.

According to the above aspect of the invention, a monocrystal exhibiting an inhibited occurrence of dislocation and capable of providing a silicon wafer having a desired low resistivity can be manufactured.

In the manufacturing method with the above arrangement, preferably, the dopant is and germanium, and the red phosphorus and the germanium are added to the dopant-added melt such that a resistivity at an upper end of the straight body is 1.2 mΩ·cm or less.

In the arrangement, misfit dislocation can be inhibited from occurring in an epitaxial silicon wafer manufactured from the monocrystal.

In the manufacturing method with the above arrangement, preferably, the dopant-added melt received in the crucible is at an amount capable of manufacturing a single one of the monocrystal, a silicon material and the dopant are added to the crucible each time the single one of the monocrystal is manufactured to manufacture a next one of the monocrystal.

In the above arrangement, the dopant concentration of the dopant-added melt can be fixed during manufacturing of monocrystals, so that a control in consideration of evaporation of the dopant is not required for manufacturing the monocrystals.

In the manufacturing method with the above arrangements, preferably, the dopant-added melt received in the crucible is at an amount capable of manufacturing a plurality of ones of the monocrystal and the plurality of ones of the monocrystal are manufactured one by one without adding a silicon material and the dopant to the crucible.

In the above arrangement, a plurality of monocrystals can be manufactured without solidifying (cooling) the dopant-added melt, so that an efficient manufacturing of the monocrystals can be achieved.

DESCRIPTION OF EMBODIMENT(S)

Exemplary embodiment(s) of the invention will be described below with reference to the attached drawings.
Structure of Monocrystal Pull-Up Apparatus Firstly, a structure of a monocrystal pull-up apparatus will be described.

Figure 3:
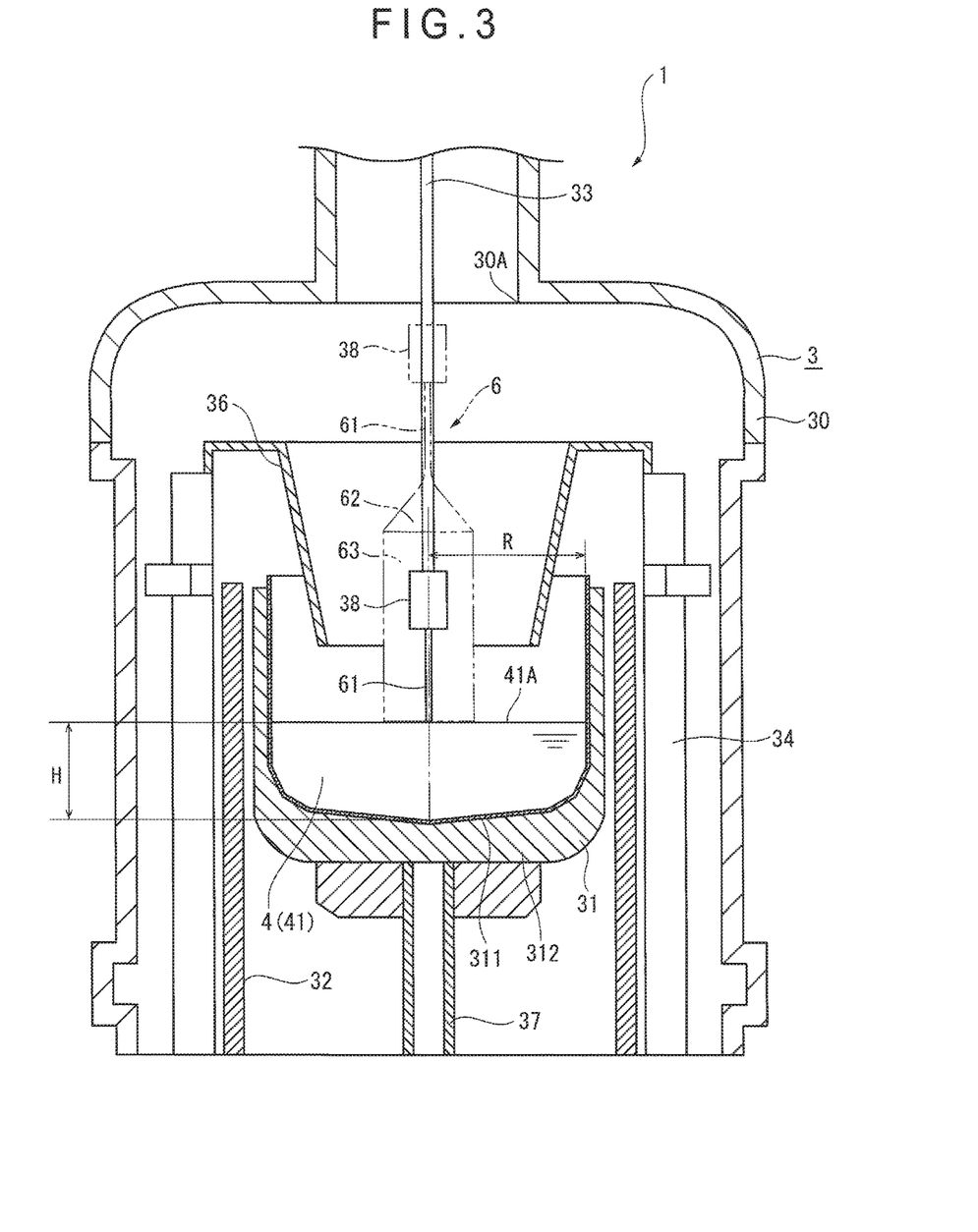
FIG. 3 is an illustration showing a schematic structure of a monocrystal pull-up apparatus according to an exemplary embodiment of the invention.

As shown in FIG. 3, a monocrystal pull-up apparatus 1 includes a monocrystal pull-up apparatus body 3, a doping device (not shown), and a controller (not shown).

The monocrystal pull-up apparatus body 3 includes: a chamber 30; a crucible 31 disposed in the chamber 30; a heater 32 configured to radiate heat to the crucible 31 to heat the crucible 31; a pull-up cable 33 serving as a pull-up unit; a heat insulating cylinder 34; and a shield 36.

Under a control by a controller, an inert gas (e.g., argon gas) at a predetermined gas flow rate is introduced into the chamber 30 from an upper side toward a lower side of the chamber 30 through an intake 30A provided on a top of the chamber 30. Moreover, a pressure in the chamber 30 (furnace pressure) is controllable by the controller.

The crucible 31 is configured to melt a polycrystalline silicon that is a raw material of a silicon wafer to provide a silicon melt 4. The crucible 31 includes: a quartz crucible 311 that is made of quartz and shaped in a bottomed hollow cylinder; and a graphite crucible 312 that is made of graphite, disposed outside of the quartz crucible 311, and houses the quartz crucible 311. The crucible 31 is supported by a support shaft 37 rotatable at a predetermined speed. In the exemplary embodiment, the cylinder of the crucible 31 has an outer diameter of 22 inch and an inner diameter of 21.44 inch.

The heater 32 is disposed outside the crucible 31 and is configured to heat the crucible 31 to melt the silicon received in the crucible 31.

A first end of the pull-up cable 33 is connected to, for instance, a pull-up drive unit (not shown) disposed on a top of the crucible 31. A second end of the pull-up cable 33 is attached as needed to a seed holder 38 configured to hold a seed crystal or a doping device (not shown). The pull-up cable 33 is rotatable when driven by the drive unit. The pull-up cable 33 is moved upward at a predetermined pull-up speed by the controller controlling the drive unit.

The heat insulating cylinder 34 is disposed surrounding the crucible 31 the heater 32

The shield 36 is a heat blocking shield configured to block radiant heat radiated upward from the heater 32.

The doping device is configured to volatilize a solid dopant in a form of red phosphorus to be doped with the silicon melt 4 in the crucible 31, in other words, configured to add red phosphorus to the silicon melt 4 to form a dopant-added melt 41. The doping device may have a cylinder whose lower end is configured to be immersed in the silicon melt 4 to add red phosphorus to the silicon melt 4, or may be configured to spray the volatilized red phosphorus over the silicon melt 4 with the lower end of the cylinder being separated from the silicon melt 4, thereby adding the red phosphorus to the silicon melt 4.

According to an input set by an operator, the controller appropriately controls the gas flow rate in the chamber 30, the furnace pressure thereof and the pull-up speed of the pull-up cable 33 to control manufacturing of a monocrystal 6.
Manufacturing Method of Monocrystal Next, an example of a method of manufacturing the monocrystal 6 using the monocrystal pull-up apparatus 1 will be described. In the exemplary embodiment, a method of manufacturing a monocrystal having a straight body in an 860-mm length and a 200-mm diameter will be described.

Firstly, referring to FIG. 4, a method of manufacturing the monocrystal 6 by a so-called multi-pull-up method will be described. The multi-pull-up method includes sharing a quartz crucible 311, charging a polysilicon material 411 every time the monocrystal 6 is pulled up, and pulling up a plurality of monocrystals 6. FIG. 3 illustrates the quartz crucible 311 in a simplified manner.

Figure 4:
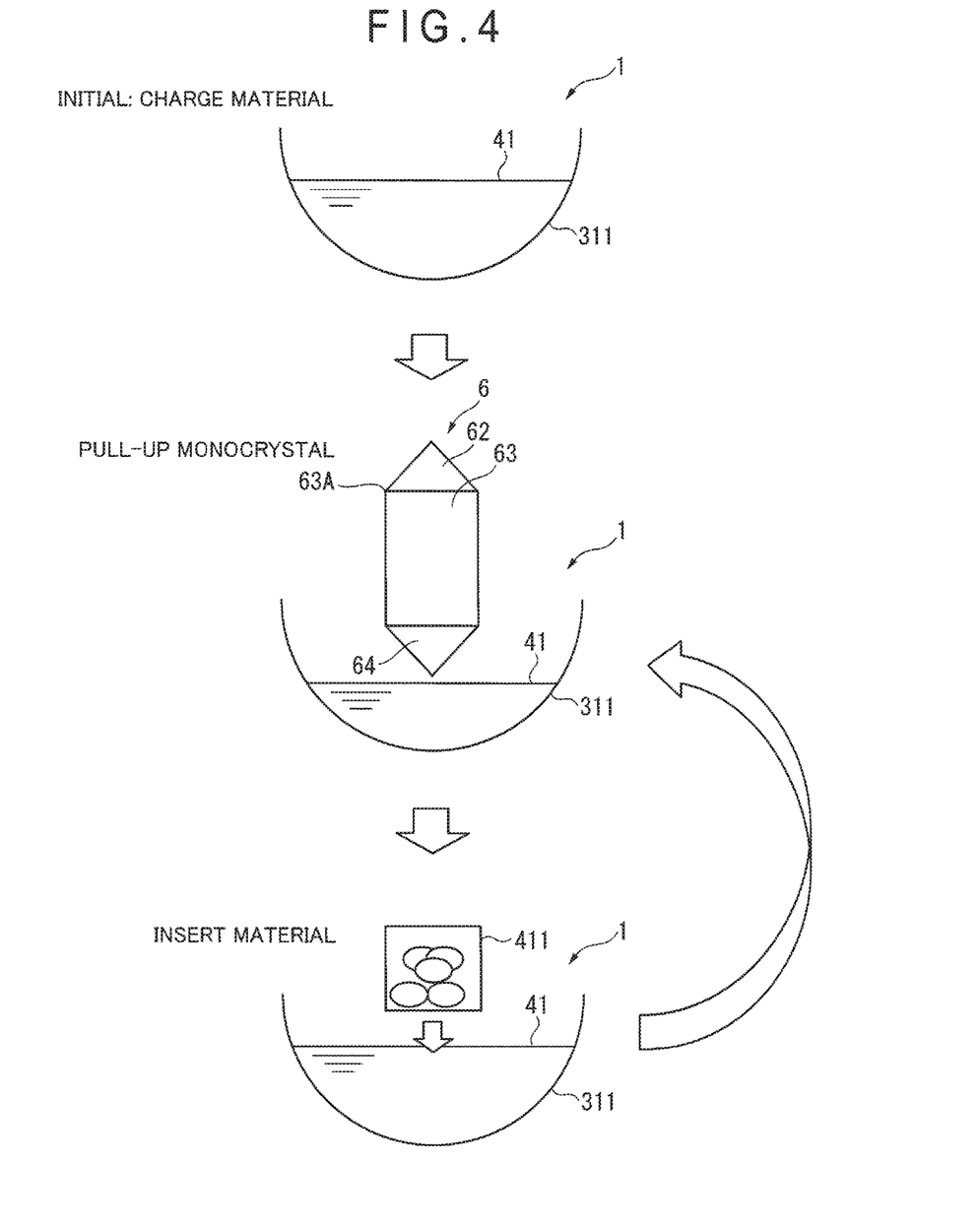
FIG. 4 is a schematic illustration showing a manufacturing method of a monocrystal by a multi pull-up method according the exemplary embodiment.

Herein, as shown in FIGS. 3 and 4, the monocrystal pull-up apparatus 1, in which the quartz crucible 311 receiving an 80-kg polysilicon material is set at an initial stage, is controlled by the controller to heat the polysilicon material to melt, subsequently, to set the gas flow rate and the furnace pressure in the chamber 30 at predetermined values respectively, and to add a volatile dopant in a form of red phosphorus to the silicon melt 4 to form the dopant-added melt 41.

It should be noted that an added amount of red phosphorus is determined so that a resistivity of a silicon wafer cut out of the monocrystal 6 is in a range from 0.6 mΩ·cm to 1.0 mΩ·cm. Moreover, germanium may be added together with red phosphorus in order to inhibit a misfit dislocation of an epitaxial silicon wafer. When adding germanium, an added amount of red phosphorus and germanium may be determined so that the resistivity of the silicon wafer is 1.2 mΩ·cm or less.

Subsequently, the controller of the monocrystal pull-up apparatus 1 immerses the seed crystal in the melt according to the input set by the operator, and then pulls up the seed crystal at a predetermined speed, thereby manufacturing the monocrystal 6.

When pulling up the seed crystal, the controller shortens a pull-up duration of time than a conventional process at least during the straight-body-formation step among the neck-formation step, the shoulder-formation step, the straight-body-formation step, the tail-formation step and the cooling step for the monocrystal 6, thereby manufacturing the monocrystal 6 having a shorter dimension than conventional ones.

Specifically, as shown in a solid line in FIG. 3, after the formation of the neck 61, providing that a distance from the lowermost portion inside the crucible 31 to the top surface 41A of the dopant-added melt 41 is defined as H (mm) and a radius of the top surface 41A of the dopant-added melt 41 is defined as R (mm), formation of shoulder 62 as shown in chain double-dashed lines in FIG. 3 is started under conditions that the formula (1) is satisfied. Subsequent to the formation of the shoulder 62, a straight body 63 and a tail 64 are formed as shown in the chain double-dashed lines in FIG. 3 and in FIG. 4, Conditions except for the pull-up duration of time, for instance, the heating condition by the heater 32 may be the same as that in a conventional process. In the exemplary embodiment using the 22-inch crucible 31, at the start of the formation of the shoulder 62, the crucible 31 receives the dopant-added melt 41 of more than 37 kg (H/R=0.4) and less than 95 kg (H/R=0.78).

According to the above steps, the monocrystal 6 having a low resistivity in a range from 0.6 mΩ·m to 1.0 mΩ·cm and an inhibited occurrence of dislocation can be manufactured.

After one monocrystal 6 is manufactured, the monocrystal pull-up apparatus 1 charges the material 411 (silicon, red phosphorus, germanium) for forming an 80-kg dopant-added melt 41 into the quartz crucible 311 and manufactures a next monocrystal 6 under conditions satisfying the formula (1) when starting to form the shoulder 62.

Herein, the controller of the monocrystal pull-up apparatus 1 preferably adjusts the furnace pressure in a range from 13.3 kPa (100 torr) to 60 kPa (450 torr) while cooling the monocrystals 6 (except for the last manufactured monocrystal 6) until the monocrystals 6 are taken out during the cooling step). At the furnace pressure of less than 13.3 kPa, red phosphorus (the volatile dopant) is evaporated, so that a resistivity of a next manufactured monocrystal 6 is increased. On the other hand, at the furnace pressure exceeding 60 kPa, an evaporated substance is liable to adhere to an inside of the chamber 30, thereby hampering monocrystallization of the monocrystal 6.

A silicon wafer obtained from the thus manufactured monocrystal 6 exhibits a resistivity in a range from 0.6 mΩ·cm to 1.0 mΩ·cm.

Modification(s)

Figure 5:
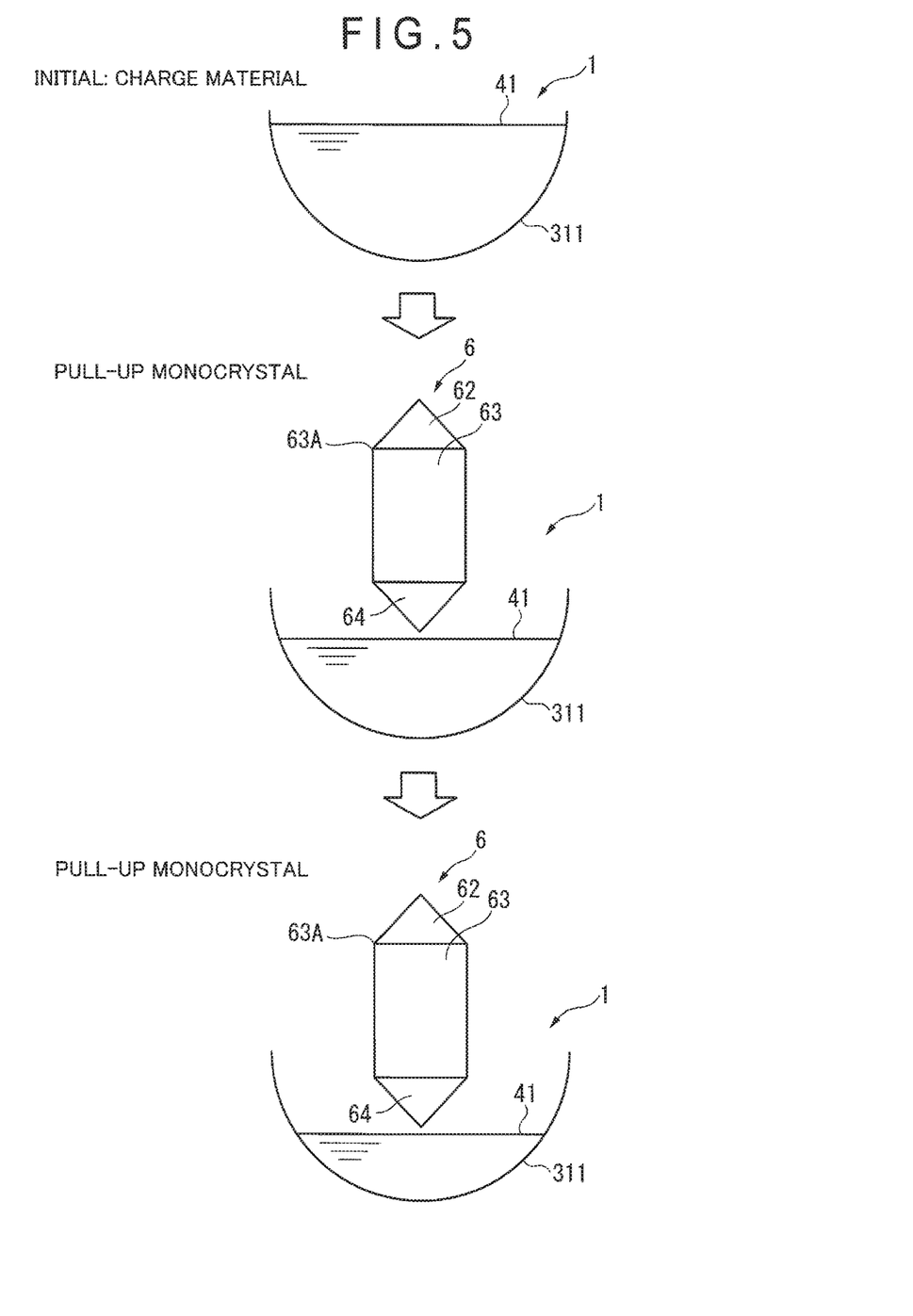
FIG. 5 is a schematic illustration showing a manufacturing method of a monocrystal by a single charge pull-up method in a modification of the invention.

It should be understood that the invention is by no means limited to only the above exemplary embodiment(s) but various improvements and design alterations are applicable to the invention as long as such improvements and alterations are compatible with the invention, For instance, instead of the multi-pull-up method as shown in FIG. 4, a so-called single-charge pull-up method may be employed to manufacture the monocrystal 6. In the single-charge pull-up method, the monocrystal pull-up apparatus 1 as shown in FIG. 5 is used, and the dopant-added melt 41 for a plurality of monocrystals is charged at one time into the shared quartz crucible 311 and a plurality of monocrystals 6 are pulled up one by one.

When two monocrystals 6 are to be manufactured, after a first one of the two monocrystals 6 is pulled up, the controller of the monocrystal pull-up apparatus 1 preferably adjusts the furnace pressure in a range from 13.3 kPa to 60 kPa while cooling the first monocrystal until the first monocrystal is taking out (i.e., during the cooling step). The reason why it is preferable to adjust the furnace pressure as described above is the same as the reason in the multi-pull-up method in the exemplary embodiment.

It should be noted that, even in the multi-pull-up method, the aforementioned single-charge pull-up method may be applied without adding the raw material when pulling up the final monocrystal.

For instance, a pull-up method may be applied in which, at the start of the formation of the shoulder 62, the dopant-added melt 41 is charged so as to satisfy H/R=0.68 at the initial stage and a monocrystal 6 having a straight body in a 400-mm length is pulled up three times in a row. Even by this method, a 200-mm diametered monocrystal 6 having a low resistivity in a range from 0.6 mΩ·cm to 1.0 mΩ·cm and an inhibited occurrence of dislocation can be manufactured.

Moreover, as the dopant to be added in the silicon melt 4, arsenic may be employed at such an amount that the resistivity of the upper end 63A of the straight body 63 is 2.0 mΩ·cm or less, or antimony may be employed at such an amount that the resistivity of the upper end 63A of the straight body 63 is 15 mΩ·cm or less.

The diameter of the monocrystal may be more than 200 mm or less than 200 mm.

When a 32-inch, 18-inch or 16-inch crucible 31 is used, the following amounts of the dopant-added melt 41 may be received in the crucible 31 at the start of the formation of the shoulder 62 in order to satisfy the above formula (1).

When a 32-inch crucible 31 is used, the amount of the dopant-added melt 41 is more than 118 kg (H/R=0.4) and less than 300 kg (H/R=0.78).

When an 18-inch crucible 31 is used, the amount of the dopant-added melt 41 is more than 19 kg (H/R=0.4) and less than 52 kg (H/R=0.78).

When a 16-inch crucible 31 is used, the amount of the dopant-added melt 41 is more than 14 kg (H/R=0.4) and less than 36 kg (H/R=0.78).

The invention claimed is:

1. A manufacturing method of a monocrystal having a shoulder-formation step to form a shoulder of the monocrystal, and a straight-body-formation step to form a straight body of the monocrystal in accordance with Czochralski process, using a monocrystal pull-up apparatus provided with a chamber, a crucible disposed in the chamber and configured to receive a dopant-added melt in which a dopant is added to a silicon melt, and a pull-up unit configured to pull up a seed crystal after the seed crystal is brought into contact with the dopant-added melt, the method comprising:

charging the dopant-added melt at an amount capable of manufacturing a plurality of monocrystals at one time in the crucible; and manufacturing the plurality of the monocrystals one by one without adding a silicon material and the dopant to the crucible, wherein provided that a distance from a lowermost portion inside the crucible to a top surface of the dopant-added melt is defined as H (mm) and a radius of the top surface of the dopant-added melt is defined as R (mm), the shoulder of each of the plurality of the monocrystals starts to be formed in a condition that a formula (1) is satisfied, $$0.4 < H/R < 0.78 \qquad (1).$$

2. The manufacturing method of a monocrystal according to claim 1, wherein the dopant is red phosphorus, and the red phosphorus is added to the dopant-added melt such that a resistivity at an upper end of the straight body of each of the plurality of the monocrystals is 1.0 mΩ·cm or less.

3. The manufacturing method of a monocrystal according to claim 1, wherein the dopant is arsenic, and the arsenic is added to the dopant-added melt such that a resistivity at an upper end of the straight body of each of the plurality of the monocrystals is 2.0 mΩ·cm or less.

4. The manufacturing method of a monocrystal according to claim 1, wherein the dopant is antimony, and the antimony is added to the dopant-added melt such that a resistivity at an upper end of the straight body of each of the plurality of the monocrystals is 15 mΩ·cm or less.

5. The manufacturing method of a monocrystal according to claim 1, wherein the dopant is red phosphorus and germanium, and the red phosphorus and the germanium are added to the dopant-added melt such that a resistivity at an upper end of the straight body of each of the plurality of the monocrystals is 1.2 mΩ·cm or less.

* * * * *